(12) United States Patent
Eiermann et al.

(10) Patent No.: US 10,439,568 B2
(45) Date of Patent: Oct. 8, 2019

(54) TRANSMISSION AMPLIFIER FOR AMPLIFYING A SIGNAL IN A WIRE-FREE TRANSMISSION SYSTEM

(71) Applicants: Franz Eiermann, Rattelsdorf-Ebing (DE); Ralph Oppelt, Uttenreuth (DE)

(72) Inventors: Franz Eiermann, Rattelsdorf-Ebing (DE); Ralph Oppelt, Uttenreuth (DE)

(73) Assignee: Siemens Aktiengesellschaft, München (DE)

( * ) Notice: Subject to any disclaimer, the term of this patent is extended or adjusted under 35 U.S.C. 154(b) by 12 days.

(21) Appl. No.: 15/562,982

(22) PCT Filed: Mar. 15, 2016

(86) PCT No.: PCT/EP2016/055573
§ 371 (c)(1),
(2) Date: Sep. 29, 2017

(87) PCT Pub. No.: WO2016/156032
PCT Pub. Date: Oct. 6, 2016

(65) Prior Publication Data
US 2018/0367108 A1 Dec. 20, 2018

(30) Foreign Application Priority Data
Mar. 30, 2015 (DE) .................. 10 2015 205 714

(51) Int. Cl.
*H03F 3/217* (2006.01)
*H02J 7/00* (2006.01)
*H02J 7/02* (2016.01)

(52) U.S. Cl.
CPC ............ *H03F 3/2171* (2013.01); *H02J 7/025* (2013.01); *H03F 3/217* (2013.01); *H03F 3/2178* (2013.01)

(58) Field of Classification Search
CPC . G01R 33/3415; G01R 33/3692; H04L 5/001; H04L 5/0066; H04L 5/143;
(Continued)

(56) References Cited

U.S. PATENT DOCUMENTS 5,378,933 A 1/1995 Pfannenmueller et al.
5,612,647 A 3/1997 Malec
(Continued)

FOREIGN PATENT DOCUMENTS

EP 0563421 A1 10/1993
EP 1505725 A1 2/2005
(Continued)

OTHER PUBLICATIONS

Balogh L: "Design and application guide for high speed MOSFET gate drive circuits"; Internet Citation; pp. 1-37; XP002552367; Gefunden im Internet: URL:http://focus.ti.com/lit/ml/slup169/slup169.pdf; 2001.
(Continued)

*Primary Examiner* — Vuthe Siek
(74) *Attorney, Agent, or Firm* — Lempia Summerfield Katz LLC

(57) ABSTRACT

A transmission amplifier is provided for amplifying the signal in a wire-free transmission system. The transmission amplifier includes a pre-amplifier stage and an amplifier output stage that is coupled to the pre-amplifier stage. The amplifier output stage is configured with gate components and is configured to provide a signal fed in as an amplified output signal on the output side.

19 Claims, 2 Drawing Sheets

(58) Field of Classification Search
CPC .. H04L 5/1469; H04W 72/0453; H03F 3/217; H03F 3/2171; H03F 3/2178; H02J 7/00; H02J 7/025
See application file for complete search history.

(56) References Cited

U.S. PATENT DOCUMENTS

| | | | |
|---|---|---|---|
| 6,211,735 | B1 | 4/2001 | Luu |
| 6,265,935 | B1 * | 7/2001 | Kaneda ................ H03F 1/0277 330/133 |
| 7,679,396 | B1 | 3/2010 | Kao |
| 8,547,177 | B1 | 10/2013 | Yoo et al. |
| 8,760,225 | B1 | 6/2014 | Wilson et al. |
| 2002/0180547 | A1 | 12/2002 | Staszewski et al. |
| 2003/0134606 | A1 | 7/2003 | Stolarczyk |
| 2006/0012428 | A1 | 1/2006 | Ohkuri |
| 2008/0129382 | A1 | 6/2008 | Outaleb et al. |
| 2008/0238549 | A1 * | 10/2008 | Freitas ................ H03F 3/4565 330/261 |
| 2011/0102224 | A1 | 5/2011 | Cathelin et al. |
| 2011/0133570 | A1 | 6/2011 | Mayo et al. |
| 2012/0146730 | A1 * | 6/2012 | Signoff ................ H03F 1/30 330/279 |
| 2012/0182070 | A1 | 7/2012 | Soussan et al. |
| 2013/0043951 | A1 | 2/2013 | Irish et al. |

FOREIGN PATENT DOCUMENTS

| | | |
|---|---|---|
| WO | WO2008063533 A1 | 5/2008 |
| WO | WO2010033727 A2 | 3/2010 |
| WO | WO2009140221 A9 | 12/2010 |
| WO | WO2013014521 A1 | 1/2013 |
| WO | WO2013053870 A2 | 4/2013 |

OTHER PUBLICATIONS

German Search Report for related German Application No. 10 2015 205 714.3 dated Feb. 4, 2016.
PCT International Search Report and Written Opinion of the International Searching Authority dated May 20, 2016 for corresponding PCT/EP2016/055573.

* cited by examiner

TRANSMISSION AMPLIFIER FOR AMPLIFYING A SIGNAL IN A WIRE-FREE TRANSMISSION SYSTEM

CROSS-REFERENCE TO RELATED APPLICATIONS

The present patent document is a § 371 nationalization of PCT Application Ser. No. PCT/EP2016/055573, filed Mar. 15, 2016, designating the United States, which is hereby incorporated by reference. This patent document also claims the benefit of DE 102015205714.3, filed on Mar. 30, 2015, which is also hereby incorporated by reference

FIELD

Embodiments relates to a transmission amplifier for amplifying a signal in a wire-free transmission system.

BACKGROUND

For inductive charging of batteries in electric vehicles, known as e-cars, antennas may be used. Apart from the actual charging antenna in a ground station and a receiving antenna with rectifier on the motor vehicle, other antennas, including a transmitting and receiving system, for certain wire-free peripheral applications between the motor vehicle and the ground station are also integrated. The peripheral applications include, for example, checking the position of the vehicle for allowing the charging to go ahead, monitoring the clearance (e.g., the clearance between the ground and the motor vehicle), checking for inanimate or animate objects during the inductive charging, and the exchange of data between the charging ground station and the charging reception station on the motor vehicle. Since temperatures of over 80° C. may occur in the unit on the motor vehicle or in the ground station during the charging operation, the peripheral applications are developed to be temperature-resistant, and the power loss involved (e.g., that of the transmission amplifiers) may be minimized. The efficiency may be as great as possible, in order not to increase the temperature in the amplifier any further by heating up, and thereby to reduce the probability of failure of the amplifier.

SUMMARY AND DESCRIPTION

The scope of the present invention is defined solely by the appended claims and is not affected to any degree by the statements within this summary. The present embodiments may obviate one or more of the drawbacks or limitations in the related art.

Embodiments provide a transmission amplifier that has a great efficiency.

In an embodiment, a transmission amplifier for amplifying a signal in a wire-free transmission system for sensor applications is provided. The transmission amplifier includes a preamplifier stage and an amplifier output stage that is coupled to the preamplifier stage. The amplifier output stage is formed from gate components and is configured to provide a fed-in signal as an amplified output signal on the output side.

Gate components also include buffers that may be a special kind of gate with only one input. Hereafter, reference is only made to the term gate or gate component.

The amplifier output stage is configured to provide high-frequency power on the output side by the fed-in signal (e.g., the controlling switching signal). The amplifier output stage may provide the fed-in signal as an amplified output signal at one or two outputs of the amplifier output stage.

The preamplifier stage may have one output or two complementary outputs. In the first case, one input of the amplifier output stage is coupled to the one output of the preamplifier stage. In the second case, two inputs of the amplifier output stage are coupled to the two complementary outputs of the preamplifier stage.

The amplifier output stage is configured as a switching amplifier for activating a balanced-to-ground load. The amplifier output stage delivers two output signals of the same power that are complementary to one another.

The transmission amplifier of one or more of the present embodiments uses gate components, at least in the amplifier output stage. The gate components are inexpensive and are efficient, because the gate components are used as switching amplifiers. In addition, with the gate components, a compact type of construction of the transmission amplifier is possible.

An embodiment provides a very compact switching amplifier output stage for wire-free transmission systems with low-cost gate components. The compact switching amplifier output stage may not be provided with other components in terms of cost and with such a great efficiency.

The gate components may be various logic gate components that are combined in a suitable way to form an amplifier output stage. Possible configurations are described in more detail below.

In the transmission amplifier, the preamplifier stage provides for the amplification between the oscillator and the amplifier output stage and switches the amplifier output stage over at the fundamental frequency almost without any power. Depending on the embodiment of the amplifier output stage, the preamplifier stage provides two activating signals that are complementary to one another or only one activating signal.

In an embodiment, the amplifier output stage includes gate components that are the same as one another (e.g., inverting or non-inverting). A preamplifier stage with two output signals that are complementary to one another is used for the activation. The two complementary signals are provided to allow the output stage to be activated in phase opposition as a switching amplifier for a balanced-to-ground load.

In an embodiment, the gate components are CMOS gate components or CMOS buffers.

The gate components may be field-effect transistors, (e.g., MOSFETs). p-channel MOSFETs and n-channel MOSFETs may be used.

In an embodiment, the preamplifier stage is a balancing stage and is configured to provide a complementary control signal for the amplifier output stage.

The preamplifier stage provides for balancing the fed-in signal.

In an embodiment, the preamplifier stage has one output (e.g., only one output) for the activation of the amplifier output stage. The amplifier output stage is configured with different gate components.

In an embodiment, the amplifier output stage includes a first part and a second part, the first part and the second part having the same number of gate components of different types of gate.

One half of the amplifier output stage contains inverting gate components, and the other half contains non-inverting gate components, that result in complementary output signals. The complementary output signals may be used as a combined balancing and amplifier output stage.

In an embodiment, the amplifier output stage includes a plurality of double gate components. Two inverting gates or buffers or two non-inverting gates or buffers are combined in one component, saving space and costs. Double gate components, each with an inverting gate and a non-inverting gate, are also possible if the components are wired in the amplifier output stage such that the amplifier output stage then delivers two complementary output signals, for example of the same power.

In an embodiment, the amplifier output stage includes four double gate components.

One half of the amplifier output stage contains two inverting double gate components, and the other half contains two non-inverting double gate components.

In an embodiment, the preamplifier stage provides two control signals that are complementary to one another for the amplifier output stage. In an embodiment, the amplifier output stage includes a first part and a second part, the first part and the second part including the same number of gate components of the same type of gate. The amplifier output stage is configured with gate components of the same type.

The preamplifier stage serves for balancing the fed-in signal. The fed-in signal may be generated by an oscillator. This oscillator may be part of the transmission amplifier arrangement.

For providing a complementary activating signal, for example, a flip-flop with a non-inverting Q1 output and an inverting Q2 output may also be used. Since such a flip-flop halves the input frequency, the oscillator may be configured to oscillate at twice the operating frequency. The flip-flop may be inserted instead of a preamplifier stage with two complementary outputs. Since the outputs of the flip-flop are complementary to one another, the two halves of the following amplifier output stage are configured as the same type (e.g., inverting or non-inverting). If the oscillator amplitude is not sufficient for activating the flip-flop, a preamplifier stage with one output may also be provided before the oscillator.

In an embodiment, the preamplifier stage includes at least one inverting gate component and one non-inverting gate component to provide the oscillator or transmission signal of the amplifier output stage in a complementary form.

In an embodiment, the balancing preamplifier stage includes a detour line for delay compensation of the gate components. The detour line may also include passive, discrete components.

To compensate for a difference in the delay between the two different gates, the difference may be compensated by a detour line or other passive components.

When using high-speed gate families, the transmission amplifier may achieve an efficiency of the transmission signal of up to 90%. The efficiency may apply to a frequency range of up to 100 MHz. At significantly higher frequencies, the efficiency of 90% may possibly not be further achieved.

In an embodiment, a system for charging batteries is provided. The system for charging batteries includes a wire-free transmission system with a transmission amplifier, as described above. The transmission amplifier may be used for various sensor applications.

The transmission amplifier may be used in a system for the contact-free charging of batteries (e.g., batteries of an electric vehicle) for peripheral applications or for, example, safety monitoring. The transmission amplifier is not used for the charging of batteries itself, but rather for sensor and/or peripheral applications that arise in the case of a system for charging batteries.

DETAILED DESCRIPTION

Figure 1:
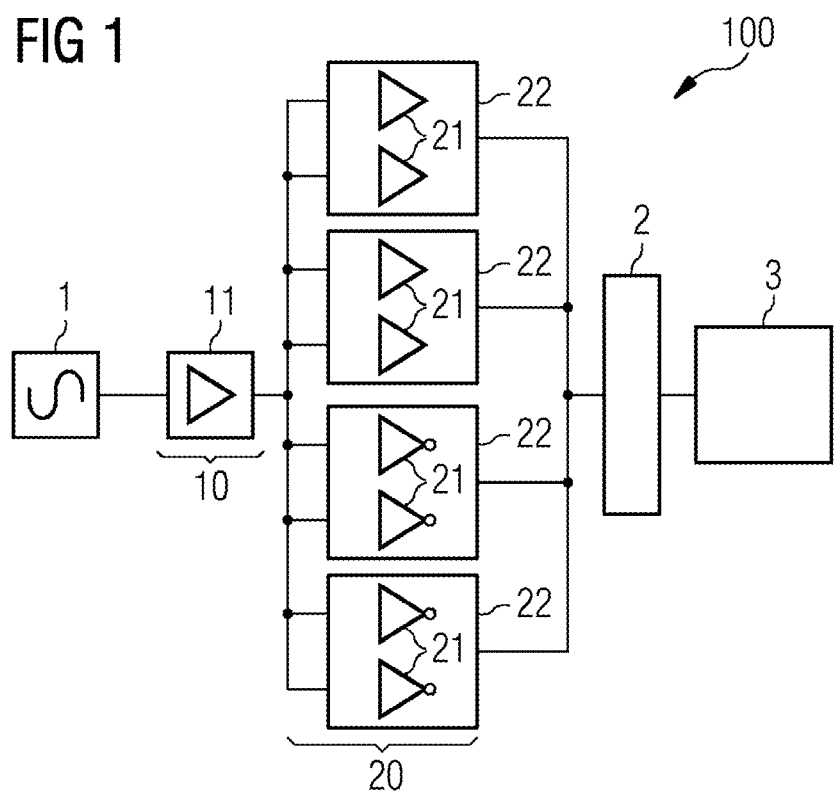
FIG. 1 depicts a schematic block diagram of an embodiment of a transmission amplifier for amplifying a signal in a wire-free transmission system.

FIG. 1 depicts an embodiment of a transmission amplifier 100 for amplifying a signal in a wire-free transmission system. The complementary output signals are realized by different types of gates in the two halves of an amplifier output stage 20.

The transmission amplifier 100 includes a preamplifier stage with only one output.

The switching amplifier output stage or amplifier output stage 20 may be formed by a plurality of gate components 21. The gate components 21 may, for example, be CMOS gate components.

The transmission amplifier 100 is configured to amplify an input signal and provide the input signal as an amplified output signal at the two outputs of the amplifier output stage 20.

The use of gate components 21 provides for the transmission amplifier 100 to be configured as a switching amplifier in a compact, low-cost form and with efficiency of about 90%.

The transmission amplifier 100 includes, for activation, an oscillator 1 and, for signal output, an impedance matching 2 and a balanced-to-ground transmission antenna 3. The elements are depicted further in FIG. 2. The impedance matching may also include a low-pass filtering in order to suppress the harmonics of the square-wave output signal.

Figure 2:
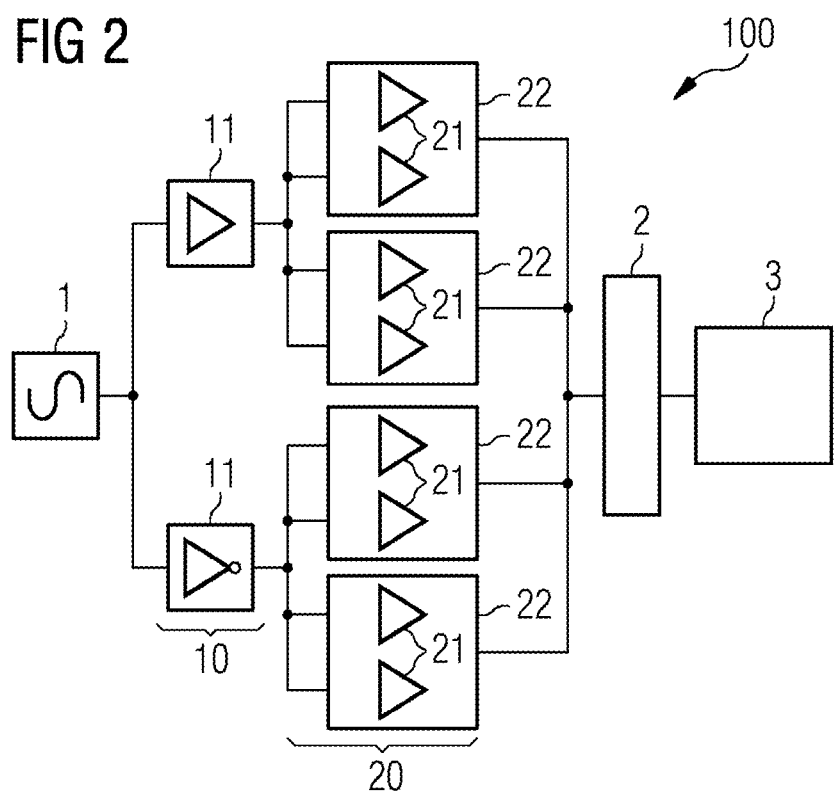
FIG. 2 depicts a circuit diagram of an embodiment of a transmission amplifier for amplifying a signal in a wire-free transmission system.

A further example of the configuration of a transmission amplifier 100 with the use of gate components is depicted in FIG. 2. The complementary activation is configured with different gates in the preamplifier stage 10. The amplifier output stage 20 includes the same gates that may be activated in phase opposition in two halves.

An oscillator 1 provides a signal to the preamplifier stage 10. The balancing preamplifier stage 10 is formed by two different gate components 11. For example, one gate component 11 is inverting and one gate component 11 is non-inverting.

The preamplifier stage 10 provides the signal from the oscillator 1 of the amplifier output stage 20 in a complementary form. The amplifier output stage 20 includes, for example, four double gate components 22 of the same type. A different number of double gate components 22 is possible. The same number of gates may be used in each half of the amplifier. If an uneven number of double gate components are provided, in the case of one of these components, the one gate of the one amplifier half and the other gate of the other amplifier half may be added.

The two amplifier output stage outputs are connected to the transmission antenna 3 by an impedance matching 2. The impedance matching 2 compensates for a difference in impedance between the amplifier and the transmission antenna 3 and suppresses any possible harmonics of the output signal.

The impedance-matched signal is fed to the transmission antenna 3. The transmission antenna 3 may, for example, be a butterfly transmission antenna.

Figure 3:
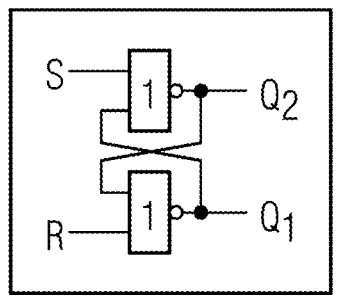
FIG. 3 depicts a circuit diagram of an embodiment of a flip-flop for balancing a signal.

Instead of different gate components 11 (FIG. 2), the balancing stage 10 may be formed by a flip-flop. An example of such a flip-flop is depicted in FIG. 3. The flip-flop includes a non-inverting Q1 output and an inverting Q2 output.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A transmission amplifier for amplifying a signal in a wire-free transmission system, the transmission amplifier comprising:
   a preamplifier stage; and
   an amplifier output stage coupled to the preamplifier stage;
   wherein the preamplifier stage is configured as a balancing stage and configured to provide a complementary control signal for the amplifier output stage;
   wherein the amplifier output stage comprises gate components, and the amplifier output stage provides a fed-in signal as an amplified output signal on an output side.

2. The transmission amplifier of claim 1, wherein an output of the preamplifier stage is coupled to an input of the amplifier output stage, or two complementary outputs of the preamplifier stage are coupled to two inputs of the amplifier output stage.

3. The transmission amplifier of claim 1, wherein the gate components are CMOS gate components.

4. The transmission amplifier of claim 1, wherein the amplifier output stage is a switching amplifier.

5. The transmission amplifier of claim 1, wherein the amplifier output stage comprises a first part and a second part, the first part and the second part comprising gate components of a same type of gate.

6. The transmission amplifier of claim 5, wherein the first part and the second part have a same number of gate components of the same type of gate.

7. The transmission amplifier of claim 1, wherein the preamplifier stage includes an output for the activation of the amplifier output stage.

8. The transmission amplifier of claim 1, wherein the amplifier output stage comprises a first part and a second part, the first part and the second part having gate components of different types of gate.

9. The transmission amplifier of claim 8, wherein the first part and the second part have the same number of gate components of different types of gate.

10. The transmission amplifier of claim 1, wherein the gate components are double gate components.

11. The transmission amplifier of claim 1, wherein the preamplifier stage for balancing comprises a plurality of gate components.

12. The transmission amplifier of claim 1, wherein the preamplifier stage comprises at least one inverting gate component and one non-inverting gate component.

13. The transmission amplifier of claim 11, wherein the preamplifier stage further comprises a detour line for delay compensation of the gate components.

14. The transmission amplifier of claim 1, wherein the wire-free transmission system is used for sensor applications.

15. A system for charging batteries, the system comprising:
   a wire-free transmission system, the wire-free transmission system comprising:
      a transmission amplifier, the transmission amplifier comprising:
         a preamplifier stage; and
         an amplifier output stage coupled to the preamplifier stage,
      wherein the amplifier output stage comprises gate components and the amplifier output stage provides a fed-in signal as an amplified output signal,
      wherein the preamplifier stage is a balancing stage and is configured to provide a complementary control signal for the amplifier output stage; and
      wherein the transmission amplifier is configured for peripheral applications when charging a battery.

16. The system of claim 15, wherein an output of the preamplifier stage is coupled to an input of the amplifier output stage, or two complementary outputs of the preamplifier stage are coupled to two inputs of the amplifier output stage.

17. The system of claim 15, wherein the gate components are CMOS gate components.

18. The system of claim 15, wherein the amplifier output stage is a switching amplifier.

19. A transmission amplifier for amplifying a signal in a wire-free transmission system, the transmission amplifier comprising:
   a preamplifier stage; and
   an amplifier output stage coupled to the preamplifier stage;
   wherein the preamplifier stage comprises at least one inverting gate component and one non-inverting gate component; and
   wherein the amplifier output stage comprises gate components, and the amplifier output stage provides a fed-in signal as an amplified output signal on an output side.

* * * * *